US009496676B2

(12) United States Patent
Kawai

(10) Patent No.: US 9,496,676 B2
(45) Date of Patent: Nov. 15, 2016

(54) OPTICAL AMPLIFIER AND CONTROL METHOD THEREOF

(71) Applicant: NEC Corporation, Tokyo (JP)

(72) Inventor: Motoyoshi Kawai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/776,030

(22) PCT Filed: Mar. 11, 2014

(86) PCT No.: PCT/JP2014/001351
§ 371 (c)(1),
(2) Date: Sep. 14, 2015

(87) PCT Pub. No.: WO2014/141684
PCT Pub. Date: Sep. 18, 2014

(65) Prior Publication Data
US 2016/0028209 A1    Jan. 28, 2016

(30) Foreign Application Priority Data

Mar. 15, 2013 (JP) ................................. 2013-053439

(51) Int. Cl.
*H01S 3/13*    (2006.01)
*H01S 3/094*    (2006.01)
(Continued)

(52) U.S. Cl.
CPC ......... *H01S 3/1301* (2013.01); *H01S 3/06754* (2013.01); *H01S 3/09408* (2013.01); *H01S 3/09415* (2013.01); *H01S 3/094061* (2013.01)

(58) Field of Classification Search
CPC .... H01S 3/10; H01S 3/0941; H01S 3/06754; H01S 3/094003; H01S 3/1605; H01S 3/1608; H01S 3/1301; H01S 3/094061; H01S 3/09408; H01S 3/09415
See application file for complete search history.

(56) References Cited

U.S. PATENT DOCUMENTS

| 6,614,588 B1 | 9/2003 | Uemura et al. | |
|---|---|---|---|
| 2003/0184850 A1* | 10/2003 | Uemura | ................. H04B 10/29 359/337.4 |
| 2005/0018726 A1* | 1/2005 | Dinger | ..................... H01S 5/40 372/38.09 |

FOREIGN PATENT DOCUMENTS

| JP | 4-3029 | 1/1992 |
|---|---|---|
| JP | 5-235445 | 9/1993 |

(Continued)

OTHER PUBLICATIONS

International Search Report and Written Opinion mailed Apr. 8, 2014 in corresponding PCT International Application.
(Continued)

*Primary Examiner* — Xinning Niu
(74) *Attorney, Agent, or Firm* — Finnegan, Henderson, Farabow, Garrett & Dunner LLP

(57) ABSTRACT

[Problem] In an optical amplifier, the excitation light level of an excited laser diode decreases, or, when the output of an excitation light is stopped, a backup excited laser diode is operated, and therefore the current consumption increases. [Solution] This optical amplifier is provided with multiple excitation laser diodes, a first current control element, a second current control element, and control means. The excitation laser diodes oscillate excitation light, the excitation light being inputted to an optical fiber amplifier. The first current control element controls a current flowing in the excitation laser diodes. The second current control element controls a current flowing in at least one of the excitation laser diodes. The control means controls the first current control element and the second current control element.

6 Claims, 3 Drawing Sheets

(51) Int. Cl.
*H01S 3/0941* (2006.01)
*H01S 3/067* (2006.01)

(56) References Cited

FOREIGN PATENT DOCUMENTS

| JP | 5-268166 | 10/1993 |
| JP | 5-268167 | 10/1993 |
| JP | 5-268186 | 10/1993 |
| JP | 8-304860 | 11/1996 |
| JP | 10-284789 | 10/1998 |
| JP | 2000-286755 | 10/2000 |
| JP | 2005-530332 | 10/2005 |
| JP | 2006-128382 | 5/2006 |
| JP | 2011-199079 | 10/2011 |

OTHER PUBLICATIONS

Japanese Office Action mailed Aug. 16, 2016, by the Japanese Patent Office in counterpart Japanese Patent Application No. 2015-505288.

\* cited by examiner

OPTICAL AMPLIFIER AND CONTROL METHOD THEREOF

CROSS-REFERENCE TO RELATED PATENT APPLICATIONS

This application is a National Stage Entry of International Application No. PCT/JP2014/001351, filed Mar. 11, 2014, which claims priority from Japanese Patent Application No. 2013-053439, filed Mar. 15, 2013. The entire contents of the above-referenced applications are expressly incorporated herein by reference.

TECHNICAL FIELD

The present invention relates to an optical amplifier for use in an optical communication system and a control method of the optical amplifier, and in particular to an excitation light module incorporated in the optical amplifier.

BACKGROUND ART

In recent years, domestic and international communication volume has sharply increased, and long-distance transmission is carried out by an optical communication system mainly. In the optical communication system, an optical amplifier in each of transponders provided in the optical transmission path at predetermined intervals amplifies signal light that has attenuated through the transmission path.

The optical amplifier in the transponder of a popular optical communication system will be described in details, referring to a drawing.

FIG. 3 is a block diagram showing an example of the optical amplifier of the transponder in the optical communication system. When the communication system is compatible with bidirectional communication in which information can be transmitted from both of the transmitting end and the receiving end, the optical amplifier amplifies the optical signal of two transmission paths, which are a transmission line A and a transmission line B. Each of the transponders in the optical communication system includes at most eight optical amplifiers inside an air-tight housing.

The optical amplifier 10 in FIG. 3 includes an erbium-doped optical fiber (EDF) 9 for each of the transmission line A and the transmission line B, and excitation light source modules 4 and 5 that oscillate excitation light. The optical amplifier 10 also includes a control circuit 7 that controls the excitation light source modules 4 and 5, an optical coupler 6 that synthesizes the excitation lights from the two modules and splits the excitation light into two beams at a predetermined ratio, and a wavelength division multiplexing (WDM) coupler 8 that couples the excitation light and the signal light and provides the coupled light to the EDF 9.

The excitation light source module 4 includes a 974 nm pumping laser diode 1 that employs InGaAs/GaAs, and a monitoring photodiode 3. The excitation light source module 5 includes a 976 nm pumping laser diode 2 that employs InGaAs/GaAs, and a monitoring photodiode 3.

The optical amplifier 10 couples and splits the excitation lights from the two excitation light source modules with the optical coupler 6, so as to provide the excitation light of the same level to the respective EDFs 9 in the transmission line A and the transmission line B. With the mentioned configuration, even though the excitation light level of one of the excitation light source modules declines, the optical signal can be amplified in the EDF 9 with the excitation light from the other excitation light source module. Thus, a redundant configuration is provided that prevents disconnection of the system. The optical amplifier 10 also includes the control circuit 7 that controls the monitoring photodiode 3 provided in the excitation light source module so as to maintain the output at a constant level. Therefore, fluctuation of the excitation light level can be suppressed, despite temporal fluctuation of ambient temperature and the pumping laser diode element.

Optical amplifiers for use in a transponder of a communication system that provide higher reliability can be found in Patent Literatures (PTL) 1 and 2. The optical amplifier according to PTL 1 prevents the life span of an excitation light source from being shortened, and controls the excitation light source so as to output the excitation light at a constant level, thus improving the reliability. PTL 2 discloses an optical amplifier having a redundant configuration including a plurality of excitation light sources, which are connected in series so as to reduce the drive current.

In addition, a technique related to the optical amplifier is disclosed in PTL 3.

CITATION LIST

Patent Literature

[PTL 1] Japanese Patent Laid-open Patent Publication No. 2006-128382
[PTL 2] Japanese Patent Laid-open Patent Publication No. H04-003029
[PTL 3] Japanese Patent Laid-open Patent Publication No. H08-304860

SUMMARY OF INVENTION

Technical Problem

In the foregoing optical amplifiers that include the pumping laser diode, a reserve pumping laser diode connected in parallel is activated in case that the excitation light from the pumping laser diode declines or the pumping laser diode stops the output, to compensate the excitation light level. In the case where the pumping laser diodes are connected in series, the drive current is increased so as to compensate the excitation light level. Therefore, the power consumption is increased.

Accordingly, the present invention provides an optical amplifier and a control method of the optical amplifier capable of maintaining the excitation light level without increasing power supply in case that a pumping laser diode currently in use is degraded.

Solution to Problem

In an aspect, the present invention provides an optical amplifier including a plurality of pumping laser diodes that each oscillate excitation light to be inputted to an optical fiber amplifier, a first current control element that controls a current flowing through the plurality of pumping laser diodes, a second current control element that controls a current flowing through at least one of the pumping laser diodes, and a control circuit that controls the first current control element and the second current control element.

In other aspect, the present invention provides an optical amplifier control method including coupling respective outputs from a plurality of pumping laser diodes that each oscillate excitation light and inputting the coupled output to an optical fiber amplifier, supplying a drive current in series to the plurality of pumping laser diodes, detecting an output of one of the plurality of pumping laser diodes, and controlling an amount of current that bypasses through other pumping laser diodes out of the drive current, on a basis of the output.

Advantageous Effects of Invention

The optical amplifier and the control method thereof according to the present invention suppress an increase in power consumption (current consumption) despite activating a reserve pumping laser diode in case that a pumping laser diode currently in use is degraded or has failed.

DESCRIPTION OF EMBODIMENT

Hereafter, exemplary embodiments of the present invention will be described in details, with reference to the drawings.

First Exemplary Embodiment

Figure 1:
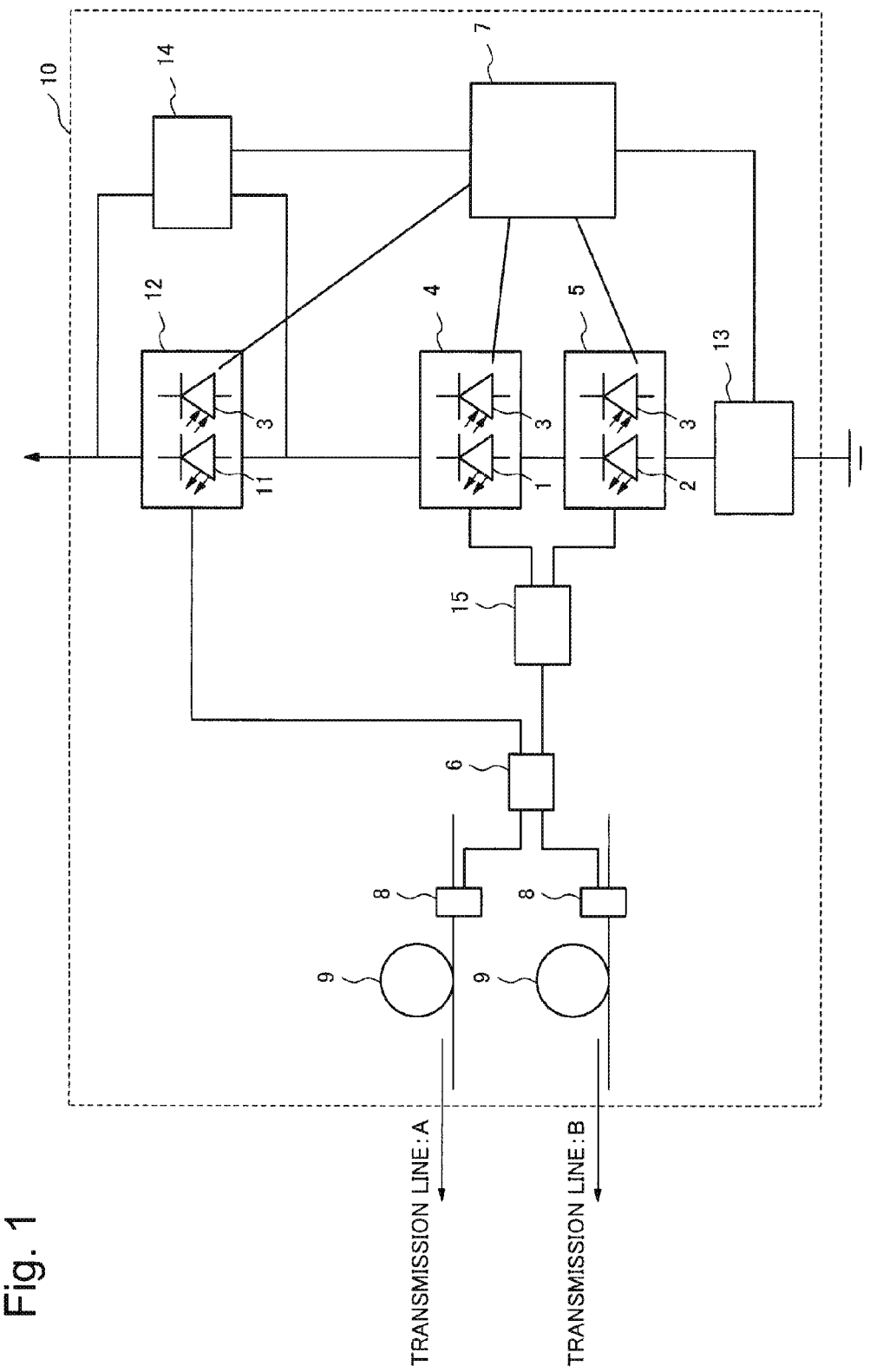
FIG. 1 is a block diagram showing an optical amplifier of a transponder in an optical communication system according to a first exemplary embodiment of the present invention.

FIG. 1 is a block diagram showing an example of an optical amplifier of a transponder in an optical communication system according to a first exemplary embodiment of the present invention. When the communication system is compatible with bidirectional communication in which information can be transmitted from both of the transmitting end and the receiving end, the optical amplifier amplifies the optical signal of two transmission paths, which are a transmission line A and a transmission line B.

As shown in FIG. 1, the optical amplifier of the transponder in the optical communication system according to the first exemplary embodiment includes an erbium-doped optical fiber (EDF) 9 provided in each of the transmission line A and the transmission line B. The optical amplifier also includes excitation light source modules 4 and 5, a reserve excitation light source module 12, a first current control element 13, a second current control element 14, a control circuit 7, a polarization beam combiner 15, an optical coupler 6, and a wavelength division multiplexing (WDM) coupler 8.

The excitation light source module 4 includes a 974 nm pumping laser diode 1 that employs InGaAs/GaAs, and a monitoring photodiode 3. The excitation light source module 5 includes a 976 nm pumping laser diode 2 that employs InGaAs/GaAs, and a monitoring photodiode 3.

The reserve excitation light source module 12 includes a reserve 974 nm pumping laser diode 11 that employs InGaAs/GaAs, and a monitoring photodiode 3.

The excitation light source module 4, the excitation light source module 5, and the reserve excitation light source module 12 are connected in series.

The first current control element 13 is connected in series to the pumping laser diode 1, the pumping laser diode 2, and the reserve pumping laser diode 11. The second current control element 14 is connected in parallel to the reserve pumping laser diode 11.

The first current control element 13 and the second current control element 14 are each controlled by the control circuit 7 so as to adjust the current flowing through the pumping laser diodes 1 and 2, and the reserve pumping laser diode 11.

The polarization beam combiner 15 controls the polarization of the excitation light from the pumping laser diode 1 and the pumping laser diode 2 and couples the excitation light into one beam. The optical coupler 6 then synthesizes the coupled excitation light and the excitation light of the reserve pumping laser diode 11, and splits into two beams at a predetermined ratio.

The WDM coupler 8 couples the excitation light and the signal light, and provides the coupled light to the EDF 9.

The monitoring photodiode 3 detects the excitation light from the pumping laser diodes 1 and 2 and the reserve pumping laser diode 11, and outputs a signal corresponding to the detected excitation light to the control circuit 7.

The control circuit 7 receives the detection signal outputted by the monitoring photodiode 3, and adjust the current flowing through the first current control element 13 and the second current control element 14.

An operation of the optical amplifier according to the first exemplary embodiment of the present invention will be described hereunder.

When the optical amplifier starts the operation, the control circuit 7 controls the first current control element 13 so as to supply a current of an initial value to the pumping laser diode 1 and the pumping laser diode 2 which are connected in series. The control circuit 7 also controls the second current control element 14 so as not to supply a current to the reserve pumping laser diode 11 connected to the pumping laser diodes 1 and 2.

In this example, the initial value of the current supplied to the pumping laser diode 1 and the pumping laser diode 2 is approximately 90% to 95% of a maximum value of the current that can be supplied to the first current control element 13. In addition, since no current is flowing through the reserve pumping laser diode 11, the entirety of the initial current is supplied to the second current control element 14 connected in parallel to the reserve pumping laser diode 11.

In case that the level of the excitation light from the pumping laser diode 1 or the pumping laser diode 2 declines, or the output of the excitation light is stopped owing to the malfunction or the like of the diode, the detection signal outputted by the monitoring photodiode 3 declines. In response to such fluctuation of the detection signal outputted, the control circuit 7 controls the second current control element 14 so as to supply a current of a value not exceeding the current value flowing through the first current control element 13, to the reserve pumping laser diode 11 connected in parallel to the second current control element 14. At this point, the current supplied to the second current control element 14 is supplied to the reserve pumping laser diode 11, and therefore the current flowing through the pumping laser diodes 1 and 2 and the reserve pumping laser diode 11 which are connected in series is not increased. The excitation light from the reserve pumping laser diode 11 is distributed to the respective EDFs 9 of the transmission line A and the transmission line B, via the optical coupler 6 and the WDM coupler 8. Thus, the excitation light level can be maintained constant.

Further, in case that both of the pumping laser diode 1 and the pumping laser diode 2 have stopped outputting the excitation light due to malfunction or the like, the control circuit 7 controls the first current control element 13 to supply a current of a maximum value, and controls the second current control element 14 so as not to supply a current. Accordingly, the first current control element 13 supplies the current to the reserve pumping laser diode 11. Since the reserve pumping laser diode 11 is connected in series to the first current control element 13 and the pumping laser diodes 1 and 2, the current flowing therethrough is not increased. Thus, the current consumption can be maintained constant, despite the reserve pumping laser diode being activated.

Here, although the excitation light of the reserve pumping laser diode 11 serves to compensate the excitation light the output of which has been stopped owing to malfunction or the like, the level of the excitation light distributed to the respective EDFs 9 of the transmission line A and the transmission line B declines to 50% of the level before the malfunction, at maximum.

Second Exemplary Embodiment

Figure 2:
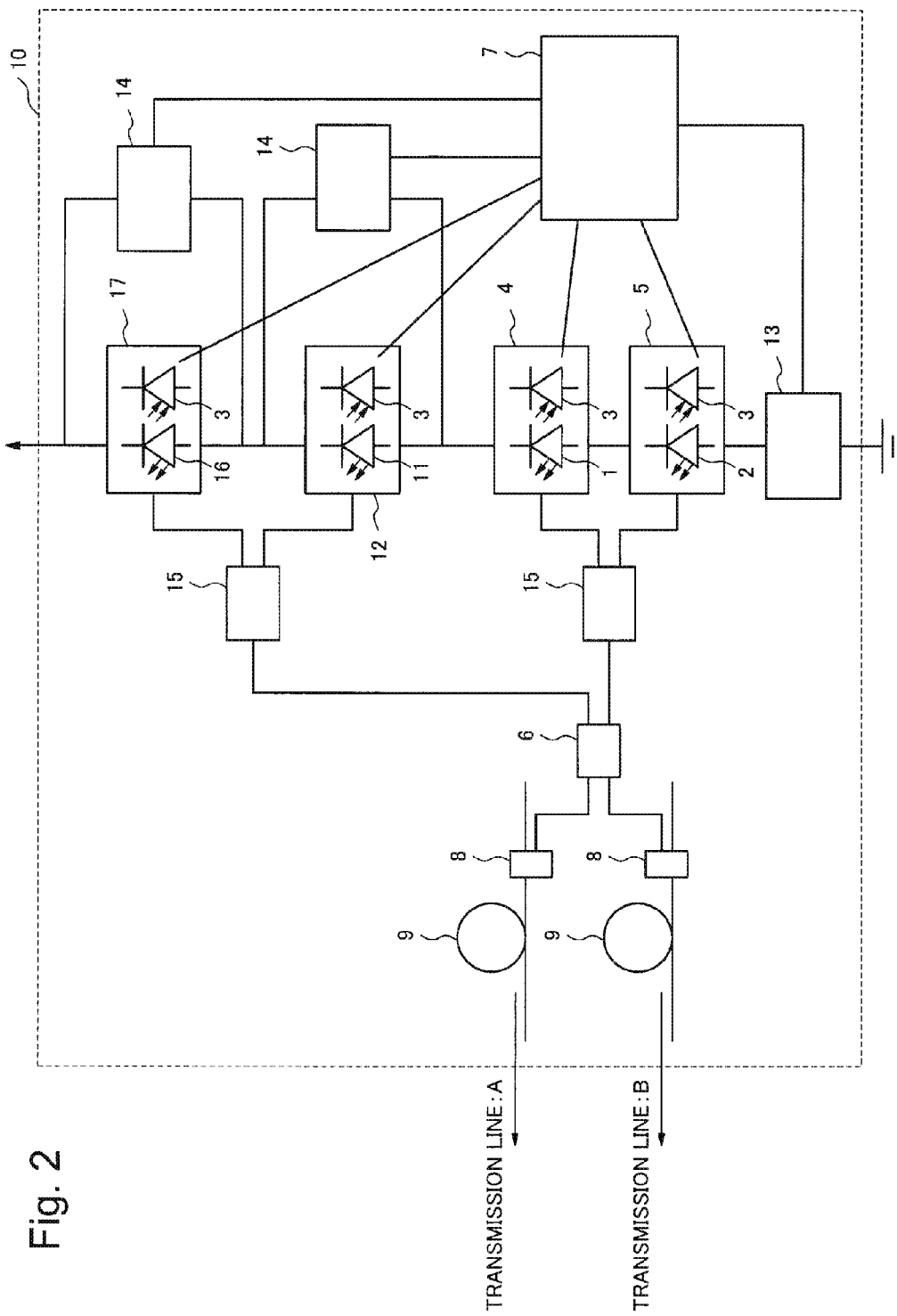
FIG. 2 is a block diagram showing an optical amplifier of a transponder in an optical communication system according to a second exemplary embodiment of the present invention.
Figure 3:
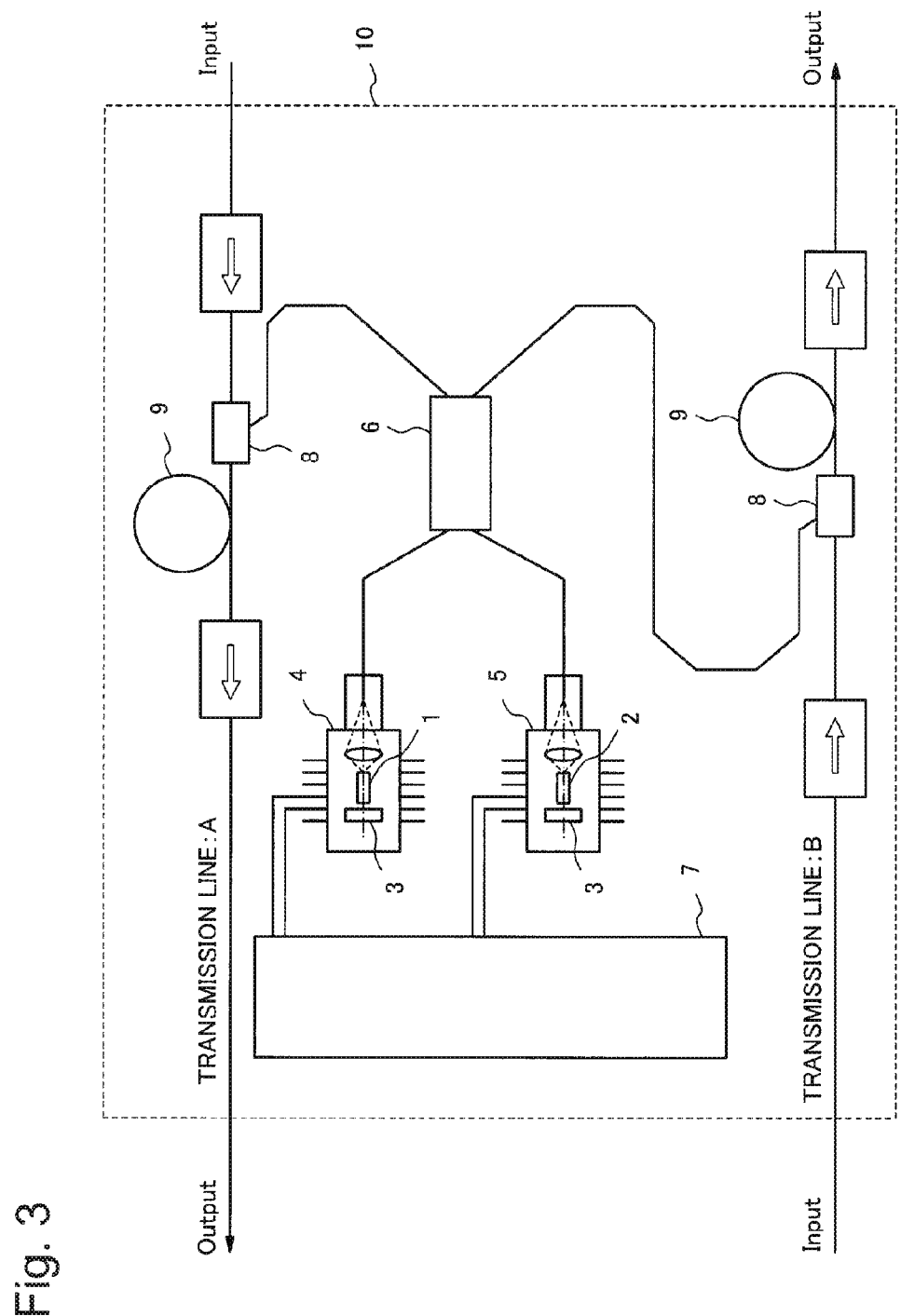
FIG. 3 is a block diagram showing an optical amplifier of a transponder in an optical communication system according to a related art.

FIG. 2 is a block diagram showing an optical amplifier of a transponder in an optical communication system according to a second exemplary embodiment of the present invention.

As shown in FIG. 2, the optical amplifier of the transponder according to the second exemplary embodiment further includes a reserve excitation light source module 17, another second current control element 14, and another polarization beam combiner 15, in addition to the configuration according to the first exemplary embodiment.

The reserve excitation light source module 17 includes a reserve 976 nm pumping laser diode 16 that employs InGaAs/GaAs, and a monitoring photodiode 3.

The reserve pumping laser diode 16 is connected in series to the first current control element 13, the pumping laser diode 1, the pumping laser diode 2, and the reserve pumping laser diode 11. The second current control element 14 is connected in parallel to the reserve pumping laser diode 16.

The polarization beam combiner 15 couples the polarized excitation light of the reserve pumping laser diode 11 and the reserve pumping laser diode 16 into one beam. The optical coupler 6 then synthesizes the coupled excitation light and the coupled excitation light of the pumping laser diodes 1 and 2, and splits into two beams at a predetermined ratio.

The remaining constituents that are the same as those of the first exemplary embodiment will be given the same numeral, and the description thereof will not be repeated.

An operation of the optical amplifier according to the second exemplary embodiment of the present invention will be described hereunder.

When the optical amplifier starts the operation, the control circuit 7 controls the first current control element 13 so as to supply a current of a predetermined value to the pumping laser diode 1 and the pumping laser diode 2 which are connected in series. The control circuit 7 also controls the second current control element 14 so as not to supply a current to the reserve pumping laser diode 11 and the reserve pumping laser diode 16.

The initial value of the current supplied to the pumping laser diode 1 and the pumping laser diode 2 is approximately 90% to 95% of a maximum value of the current that can be supplied to the first current control element 13. In addition, since no current is flowing through the reserve pumping laser diode 11 and the reserve pumping laser diode 16, the entirety of the initial current is supplied to the second current control element 14 connected in parallel to the reserve pumping laser diodes 11 and 16.

In case that the level of the excitation light from the pumping laser diode 1 or the pumping laser diode 2 declines, or the output of the excitation light is stopped, the detection signal outputted by the monitoring photodiode 3 declines. In response to such fluctuation of the detection signal outputted, the control circuit 7 controls the second current control element 14 so as to supply a current of a value not exceeding the current value flowing through the first current control element 13, to the reserve pumping laser diode 11 or the reserve pumping laser diode 16. At this point, the current supplied to the second current control element 14 is supplied to the reserve pumping laser diode 11 or the reserve pumping laser diode 16, and therefore the current flowing through the pumping laser diodes 1 and 2, the reserve pumping laser diode 11, and the reserve pumping laser diode 16 which are connected in series is not increased. Further continuing the description of the operation, the excitation light from the reserve pumping laser diode 11 and the reserve pumping laser diode 16 is distributed to the respective EDFs 9 of the transmission line A and the transmission line B, via the polarization beam combiner 15, the optical coupler 6 and the WDM coupler 8. Thus, the excitation light level can be maintained constant.

As additional advantage, the decline of the excitation light level is compensated with the pumping laser diode of the same wavelength, and therefore the profile shape of the light outputted by the EDF can be maintained. Accordingly, the gain of the EDF, which depends on the wavelength, can be maintained. In practical use where the transponders in the optical communication system are connected in multiple stages, the cumulative profile shape of the light outputted by the EDF can also be maintained, and thus the gain of the EDF can be maintained.

Further, in case that both of the pumping laser diode 1 and the pumping laser diode 2 have stopped outputting the excitation light due to malfunction or the like, the control circuit 7 controls the first current control element 13 to supply a current of a maximum value, and controls the second current control element 14 so as not to supply a current. Accordingly, the first current control element 13 supplies the current to the reserve pumping laser diode 11 and the reserve pumping laser diode 16. Since the reserve pumping laser diode 11 and the reserve pumping laser diode 16 are connected in series to the first current control element 13 and the pumping laser diodes 1 and 2, the current flowing therethrough is not increased.

As described above, the excitation light of the reserve pumping laser diodes 11 and 16 serves to compensate the decline of the level of the excitation light from the pumping laser diodes 1 and 2, and therefore the level of the excitation light distributed to the respective EDFs 9 of the transmission line A and the transmission line B can be maintained constant.

As a different effect of this case, the profile shape of the light outputted by the EDF can be maintained.

As described thus far, the optical amplifier according to the present invention is configured to activate the reserve pumping laser diode connected in series to the pumping laser diode in case that the excitation light level of the pumping laser diode has declined or the output of the excitation light has stopped, and therefore the level of the excitation light can be maintained, and the increase of current consumption can be suppressed.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2013-053439, filed on Mar. 15, 2013, the disclosure of which is incorporated herein in its entirety by reference.

REFERENCE SIGNS LIST 1 974 nm pumping laser diode
2 976 nm pumping laser diode
3 Monitoring photodiode
4, 5 Excitation light source module
6 Optical coupler
7 Control circuit
8 WDM coupler
9 EDF
10 Optical amplifier
11 Reserve 974 nm pumping laser diode
12 Reserve excitation light source module
13 First current control element
14 Second current control element
15 Polarization beam combiner
16 Reserve 976 nm pumping laser diode
17 Reserve excitation light source module

The invention claimed is:

1. An optical amplifier comprising:
a plurality of pumping laser diodes that oscillate excitation light to be inputted to an optical fiber amplifier, the plurality of pumping laser diodes including at least a first and a second pumping laser diodes that oscillate excitation light of a generally same wavelength;
a first current control element that controls currents flowing through at least the first and second pumping laser diodes;
a second current control element that controls at least the current flowing through the second pumping laser diode; and
a control circuit that controls the first current control element and the second current control element;
wherein when a light level generated by the first pumping laser diode declines, the control circuit controls the first and second current control elements to adjust the current flowing through the second pumping laser diode, so as to compensate the light level.

2. The optical amplifier according to claim 1, wherein each of the pumping laser diodes includes a photodiode that detects output light, and
the control circuit controls at least one of the first current control element and the second current control element, on a basis of an output signal from the photodiode.

3. The optical amplifier according to claim 1, wherein the second current control element is connected in parallel to at least one of the pumping laser diodes.

4. The optical amplifier according to claim 1, wherein the plurality of pumping laser diodes is connected in series, and
the first current control element controls a current flowing through the plurality of pumping laser diodes, in accordance with the control of the control circuit.

5. A method of controlling an optical amplifier, the method comprising:
coupling respective outputs from a plurality of pumping laser diodes that oscillate excitation light and inputting the coupled output to an optical fiber amplifier, the plurality of pumping laser diodes including at least a first and a second pumping laser diodes that oscillate excitation light of a generally same wavelength;
supplying, via a first current control element, currents to the first and second pumping laser diodes;
detecting a light level generated by the first pumping laser diode; and
when the light level declines, controlling, via the first and a second current control elements, an amount of current that flows through the second pumping laser diode to compensate the light level.

6. An optical amplifier comprising:
a plurality of oscillate means for oscillating excitation light to be inputted to an optical fiber amplifier, the plurality of oscillate means including at least first and second oscillate means that oscillate excitation light of a generally same wavelength;
first current control means for controlling currents flowing through at least the first and second oscillate means;
second current control means for controlling at least the current flowing through the second oscillate means; and
control means for controlling the first current control means and the second current control means;
wherein when a light level generated by the first oscillate means declines, the control circuit controls the first and second current control means to adjust the current flowing through the second oscillate means, so as to compensate the light level.

* * * * *